United States Patent [19]
Arimoto

[11] Patent Number: 4,982,368
[45] Date of Patent: Jan. 1, 1991

[54] DYNAMIC SEMICONDUCTOR MEMORY DEVICE HAVING AN ENLARGED OPERATING MARGIN FOR INFORMATION READING

[75] Inventor: Kazutami Arimoto, Hyogo, Japan

[73] Assignee: Mitsubishi Denki Kabushiki Kaisha, Tokyo, Japan

[21] Appl. No.: 463,207

[22] Filed: Jan. 10, 1990

[51] Int. Cl.[5] .............................................. G11C 13/00
[52] U.S. Cl. .............................. 365/206; 365/189.04; 365/207
[58] Field of Search ...................... 365/189.01, 189.04, 365/189.05, 206, 207, 230.01, 230.05

[56] References Cited
U.S. PATENT DOCUMENTS
4,542,486  9/1985  Anami et al. .

OTHER PUBLICATIONS

Aoki et al., "A 1.5 V DRAM for Battery-Based Applications", IEEE International Solid-State Circuits Conference, Session 16: Dynamic RAMs, pp. 238-239, Feb. 1989.

Tsuchida et al., "An Experimental 16 Mb CMOS DRAM with a 100 MHz Serial Read/Write Mode", SDM88-20, pp. 47-53.

Primary Examiner—Terrell W. Fears
Attorney, Agent, or Firm—Lowe, Price, LeBlanc, Becker & Shur

[57] ABSTRACT

A dynamic semiconductor memory comprising memory cells arranged in a matrix of row and columns, a half of the memory cells being formed into sub-array #1 and the remaining half into sub-array #2. One of a plurality of bit lines included in sub-array #1 and one of a plurality of bit lines included in sub-array #2 constitute a bit line pair. Each of a plurality of word lines corresponding to the columns is divided into a first word line belonging to sub-array #1 and a second word line belonging to sub-array #2. When one of word lines is selected, a potential is applied to one of the first or second word line. As a result, when the information charge of a memory cell is output to certain bit line pair, a reading operation does not take place for the bit lines adjacent thereto, with the latter maintained at a predetermined potential. Thus, the bit line pair is free from the influence of noise due to a potential variation of the adjacent bit lines and the influence of the potential within the bit line pair itself.

14 Claims, 11 Drawing Sheets

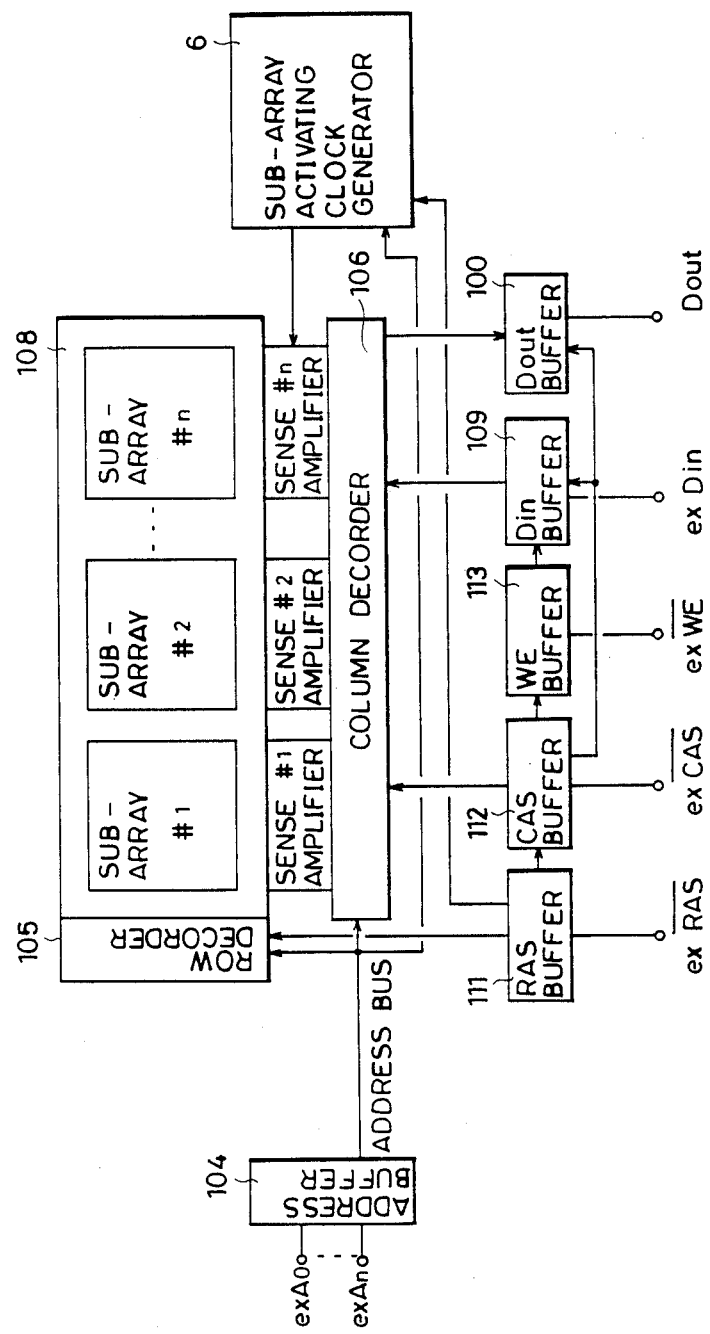

DYNAMIC SEMICONDUCTOR MEMORY DEVICE HAVING AN ENLARGED OPERATING MARGIN FOR INFORMATION READING

BACKGROUND OF THE INVENTION

1. Field of the Invention

This invention relates to dynamic semiconductor memories, and more particularly to a dynamic semiconductor memory having an enlarged operating margin for information reading and a reduced soft error rate.

2. Description of the Background Art

FIG. 8 is a block diagram showing an example of commonly known dynamic semiconductor memories (which are referred to hereinafter as DRAMs or dynamic random access memories).

Referring to the drawing, this DRAM comprises a memory cell array 508 including a plurality of memory cells arranged in a matrix form for storing data signals, an address buffer 504 for receiving address signals to select the memory cells, a row decoder 505 and a column decoder 506 for decoding the address signals, and a sense amplifier 603 connected to the memory cell array 508 for amplifying and reading out the signals stored in the memory cells. An input buffer 509 for inputting the data signals and an output buffer 600 for outputting the data signals are connected to the memory cell array 508 through an I/O gate 507.

The address buffer 504 is connected to receive external address signals ext. A0–A9.

FIG. 9 is a view showing the specific construction of a portion of the memory cell array 508 and sense amplifier 603 shown in FIG. 8.

In the drawing, word lines WL1 and WL2 and dummy word lines DWLo and DWLe are arranged to extend in a direction intersecting bit lines BL and $\overline{BL}$. A memory cell selecting transistor QM1 and a capacitor MC1 constituting a memory cell are connected in series to an intersection of word line WL1 and bit line BL. A similar memory cell is connected also to an intersection of word line WL2 and bit line $\overline{BL}$. Further, a dummy cell selecting transistor QD and a dummy cell capacitor DC0 constituting a dummy cell are connected in series to an intersection of dummy word line DWLo and bit line BL. Similarly, a dummy cell is connected to an intersection of dummy word line DWLe and bit line $\overline{BL}$.

One end of each of the bit lines BL and $\overline{BL}$ is coupled to a precharge potential $V_{PRC}$ through a precharge transistor QP or QP'. The precharge potential $V_{PRC}$ is maintained at a potential of Vcc/2. Further, the bit lines BL and $\overline{BL}$ are interconnected through a transistor QE. A precharge signal $\phi_{PRC}$ is applied to the respective gates of transistors QP, and QP' and QE. A sense amplifier SA is connected to bit lines BL and $\overline{BL}$ for detecting and amplifying a potential difference occurring between the bit lines. The sense amplifier SA is applied with ground potential through a transistor Q1 and source potential Vcc through a transistor Q2. A sense amplifier activating signal $\phi_S$ is applied to the gate of transistor Q1. A sense amplifier activating signal $\overline{\phi_S}$ is applied to the gate of transistor Q2.

The other ends of bit lines BL and $\overline{BL}$ are connected to input and output lines I/O and $\overline{I/O}$ through transistors QT and QT' constituting the I/O gate 507, respectively. A decode signal is applied by the column decoder 506 to the gates of transistors QT and QT'.

An operation of the semiconductor memory shown in FIGS. 8 and 9 will be described next with reference to the timing chart of FIG. 10.

When external signal ex.$\overline{RAS}$ falls, the potential of word lines WL is raised to "H" level. Simultaneously the potential of one of the dummy word lines DWLo and DWLe falls.

On the other hand, the output of precharge signal $\phi_{PRC}$ becomes "L" level before the potential level of the word lines rises, thereby placing the bit lines in the floating state. When word line WL1 is selected, for example, the potential of word line WL rises to "H", and at the same time dummy word line DWLo is selected with its potential falling to "L" level. Consequently, the memory cell selecting transistor QM1 becomes conductive to connect memory cell MC1 to bit line BL. When, for example, an "H" level potential is stored in memory cell MC1 connected to bit line BL, the potential of bit line BL rises by a value determined by a ratio between its stray capacitance $C_{BL}$ and capacity $C_S$ of memory cell MC. On the other hand, the potential of bit line $\overline{BL}$ remains at Vcc/2 and serves as a reference potential for the potential of bit line BL. Subsequently, sense amplifier activating signal $\phi_S$ becomes "H" level, and signal $\overline{\phi_S}$ becomes "L" level, whereby the sense amplifier SA is activated through transistors Q1 and Q2. As a result, the potential of bit line BL becomes Vcc, while the potential of bit line $\overline{BL}$ becomes ground potential, to complete a sense operation. In the series of operating steps as described above, the potential of bit line BL rises with the rise of the potential of word line WL1, which is due to a capacity coupling through stray capacitance CP present between a connection of memory cell selecting transistor QM1 with bit line BL and word line WL1 as shown in FIG. 11, and which affects the operating margin for signal reading. Particularly, when an "L" level potential is stored in memory cell MC1, the potential of bit line BL rises due to the capacity coupling. As a result, what should be lower than the potential of bit line BL becomes higher, thereby causing an error of reading "L" level information as "H" level information. Dummy cell DC is provided in order to cancel this potential variation of bit line BL. By causing the potential of dummy word line DWLo to fall with selection of word line WL1, bit line BL is applied with what is opposite and corresponds in degree to the potential variation occurring on bit line BL when word line WL1 rises. That is, the influence of the potential variation upon the reading operation is eliminated by applying an opposite and an equivalent potential variation to bit line BL.

FIG. 12 is a view schematically showing the construction of a memory cell array in a known DRAM employing the folded bit line system.

In the drawing, a plurality of bit line pairs BL (BL$_A$--BL$_E$) and $\overline{BL}$ ($\overline{BL}_A$-$\overline{BL}_E$) are arranged to intersect a plurality of word lines WL (WL1–WL4). Memory cells MC are arranged at and connected to intersections of bit lines BL or $\overline{BL}$ and word lines WL in opposed relationship to folded bit lines. Bit lines BL$_A$ and $\overline{BL}_A$, BLB and $\overline{BL}_B$, ... BL$_E$ and $\overline{BL}_E$ forming pairs are connected to sense amplifiers SA$_A$, SA$_B$, ... SA$_E$, respectively.

The manner in which information is read from memory cell MC1 will be described now. As described with reference to FIGS. 9 and 10, the potential of word line WL1 rises first, and data are read from the memory cells connected to word line WL1. Looking at the entire memory cell array, data are output to bit lines BL$_A$--

$BL_E$. Bit lines $\overline{BL_A}$-$\overline{BL_E}$ forming the pairs with the bit lines for which the data are read, act as reference bit lines and are maintained at a reference potential. Thereafter sense amplifiers $SA_A$-$SA_E$ are activated to amplify the data read out.

Potentials of the bit lines forming a pair in data reading will be calculated. A potential difference between bit lines $BL_B$ and $\overline{BL_B}$ in FIG. 12 is determined as one of example here. FIG. 13 shows an equivalent circuit for this case. In FIG. 13, reference $C_1$ denotes a capacitance occurring between each bit line and ground potential through a substrate, $C_2$ a capacitance between adjacent bit lines, $C_M$ a capacity of each memory cell, and $C_D$ a capacity of each dummy cell. It is assumed that bit lines $BL_B$ and $\overline{BL_B}$ have potentials $V_{BLB}$ and $V_{\overline{BLB}}$, respectively, and that the precharge level of the bit lines is Veq. The potentials of other bit lines $BL_A$, $\overline{BL_A}$, $BL_C$ and $\overline{BL_C}$ are assumed to be $V_{BLA}$, $V_{\overline{BLA}}$, $V_{BLC}$ and $V_{\overline{BLC}}$, respectively.

The following equation is formed for the charges of bit line $BL_B$ before and after the data reading:

$$C_1 V_{eq} + C_S (\tfrac{1}{2} \pm \tfrac{1}{2}) V_{cc} = C_1 V_{BLB} + \qquad (1)$$
$$C_2 (V_{BLB} - V_{BLA}) + C_2 (V_{BLB} - V_{\overline{BLB}}) + C_M V_{BLB}$$

The plus sign "+" in the parenthesis of the coefficient of Vcc in the left side of the equation signifies that the memory cell stores "H" level information ($V_{cc}$ writing), while the minus ("−") sign signifies that the memory cell stores "L" level information ((0 V) writing). The left side shows the charges stored in capacitance $C_1$ and capacity $C_S$ of the memory cell before the data reading. The right side shows the charges stored in capacitance $C_1$, capacitance $C_2$ between adjacent bit lines and memory cell capacity $C_M$ after the data reading.

Similarly, the following equation is formed for the potential of bit line $\overline{BL_B}$:

$$C_1 V_{eq} + C_D V_{cc}/2 = C_1 V_{\overline{BLB}} + \qquad (2)$$
$$C_2 (V_{\overline{BLB}} - V_{BLB}) + C_2 (V_{\overline{BLB}} V_{\overline{BLC}}) + C_D V_{\overline{BLB}}$$

The left side of equation (2) shows the charges stored in capacitance $C_1$ and capacit $C_D$ of the dummy cell before the data reading. The right side shows the charges stored in capacitance $C_1$, capacitance $C_2$ between adjacent bit lines and dummy cell capacit $C_D$ after the data reading. Capacity of the dummy cell is set equal to capacit $C_M$ of the memory cell to serve the intended purpose. A further calculation is made as follows, with $C_S$ representing the capacity of the dummy cell and memory cell.

When the data are output to bit line $BL_B$, the potential of bit line $\overline{BL_B}$ is at the reference potential. Potential difference $\Delta V$ between bit lines $BL_B$ and $\overline{BL_B}$ are derived from equations (1) and (2) as follows:

$$\Delta V = |V_{BLB} - V_{\overline{BLB}}| = C_S V_{cc}/2(C_1 + 4C_2 + C_S) \qquad (3)$$

Thus, when capacitance $C_2$ between the bit lines increases with the array having an increasingly fine structure or for other reasons, potential difference $\Delta V$ decreases since $C_1$ and $C_S$ are constant, which tends to reduce the reading margin and deteriorate the soft error. Further, at times of sense amplification, capacitance $C_2$ acts as a source of noise for the amplification of data, thereby likewise deteriorating the operating margin.

SUMMARY OF THE INVENTION

An object of this invention is to improve reliability of the reading operation in the dynamic semiconductor memory.

Another object of this invention is to enlarge the operating margin for the reading operation in the dynamic semiconductor memory.

A further object of this invention is to prevent a substantial reduction in the read potential during a reading operation in the dynamic semiconductor memory.

A still further object of this invention is to reduce the noise transmitted from adjacent bit lines in the dynamic semiconductor memory.

A still further object of this invention is to eliminate influences of each pair of bit lines upon another pair during a reading operation in the dynamic semiconductor memory.

A still further object of this invention is to reduce the area occupied by the sense amplifier while enlarging the operating margin for the reading operation in the dynamic semiconductor memory.

In order to achieve the above objects, a dynamic semiconductor memory device comprises a plurality of memory cells arranged in a matrix of rows and columns for storing information charges, a plurality of bit line pairs each constituted of two bit lines spaced away from each other, each of the bit lines corresponding to a row of the memory cells and connected to the memory cells in the corresponding row, a plurality of word lines extending in a direction to intersect the bit line pairs, each of the word lines corresponding to a column of the memory cells and connected to the memory cells in the column, a read device for selecting one of the word lines by applying a potential thereto, and outputting the information charge of each of the memory cells connected to the selected word line to one of the bit lines in each of the bit line pairs, and a plurality of sense amplifiers provided one for each of the bit line pairs for detecting a potential difference occurring between the bit lines in each of the bit line pairs when the information charges are read from the memory cells by the read device, wherein bit lines adjacent the bit line, which is connected to the memory cell from which the information charge is read, in each of the bit line pairs are maintained at a predetermined potential when the information charges are read from the memory cells by the read device.

In order to achieve the above objects, a dynamic semiconductor memory device according to another aspect of this invention comprises a plurality of memory cells arranged in a matrix of rows and columns for storing information charges, a first memory cell area including a half of the memory cells, a second memory cell area including the remaining half of the memory cells, a plurality of bit line pairs each constituted of two bit lines, one of the bit lines corresponding to a row of the memory cells formed in the first memory cell area, and the other bit line corresponding to a row of the memory cells formed in the second memory cell area, each bit line being connected to the memory cells in each of the corresponding rows, a plurality of word lines each extending in a direction to intersect the bit line pairs and corresponding to a column of the memory cells, each of the word lines being divided at a boundary between the first and second memory cell areas into a first word line belonging to the first memory cell area and a second word line belonging to the second memory cell area, and connected to the memory cells in the corresponding column, a read device for selecting one of the word lines and applying a potential to one of the first and second word lines of the selected word line to output the information charge of each of the memory cells connected to a selected one of the first and second word lines to one of the bit lines in each of the bit line pairs, and a plurality of sense amplifiers each provided corresponding to each of the bit line pairs for detecting a potential difference occurring between the bit lines in each of the bit line pairs when the information charges are read from the memory cells by the read device, wherein bit lines adjacent the bit lines, in each of the bit line pairs which is connected to the memory cell from which the information charge is read, are maintained at a predetermined potential when the information charges are read from the memory cells by the read device.

With the semiconductor memory according to this invention as constructed above, the operating margin for a reading operation is increased since, when information of a memory cell is output to a certain bit line pair, the potential of bit lines adjacent thereto is maintained at a predetermined potential.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a block diagram showing the memory cell array and adjacent components according to the first embodiment of this invention.

DESCRIPTION OF THE PREFERRED EMBODIMENTS

Figure 1:
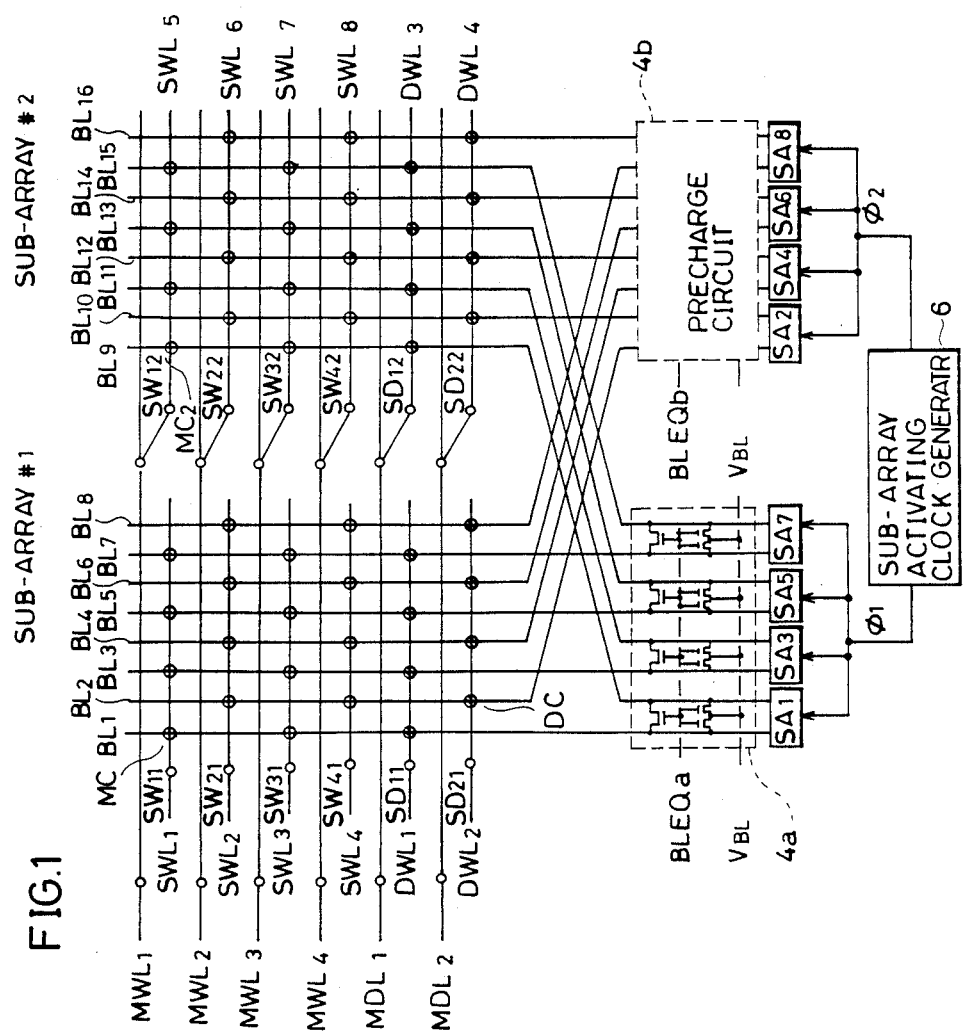
FIG. 1 is a view showing the construction of a memory cell array in a DRAM according to a first embodiment of this invention.

FIG. 1 is a view showing the construction of a memory cell array in a DRAM according to a first embodiment of this invention.

In the drawing, word lines include main word lines MWL1–MWL4 and supplementary word lines SWL1–SWL8 for memory cells, and main dummy word lines MDL1 and MDL2 and supplementary dummy word lines DWL1–DWL4 for dummy cells. The respective supplementary word lines are connected to the corresponding main word lines through switching devices SW11–SW41, SW12–SW42 and SD11–SD22. Memory cells MC and dummy cells DC are arranged at intersections of the supplementary word lines and bit lines in opposed relationship to folded bit lines. The memory cells on the lefthand side of switching devices SW12–SW42, SD12 and SD22 in the drawing constitute a sub-array #1, and those on the righthand side a sub-array #2. Each of the bit lines BL1–BL16 intersecting one set of supplementary word lines is paired with a bit line intersecting the other set of supplementary word lines, each bit line pair being connected to a corresponding sense amplifier. For example, bit line BL1 belonging to sub-array #1 and bit line BL9 belonging to sub-array #2 form a bit line pair which is connected to sense amplifier SA1 through a precharge circuit 4a. Similarly, bit lines BL2 and BL10, bit lines BL3 and BL11 and so on form respective bit line pairs connected to sense amplifiers SA2–SA8 through precharge circuit 4a or 4b. A signal BLEQa is connected to the gates of transistors included in the precharge circuit 4a, and precharge potential $V_{BL}$ is applied to the bit line pairs when the transistors are turned on. Similarly, a signal BLEQb is connected to the gates of transistors included in the precharge circuit 4b, and precharge potential $V_{BL}$ is applied to the bit line pairs when the transistors are turned on. Sense amplifiers SA1, SA3, SA5 and SA7 connected to the precharge circuit 4a receive a signal $\phi_1$ from a sub-array activating clock generator 6. Sense amplifiers SA2, SA4, SA6 and SA8 connected to the precharge circuit 4b receive a signal $\phi_2$ from the sub-array activating clock generator 6.

Figure 2:
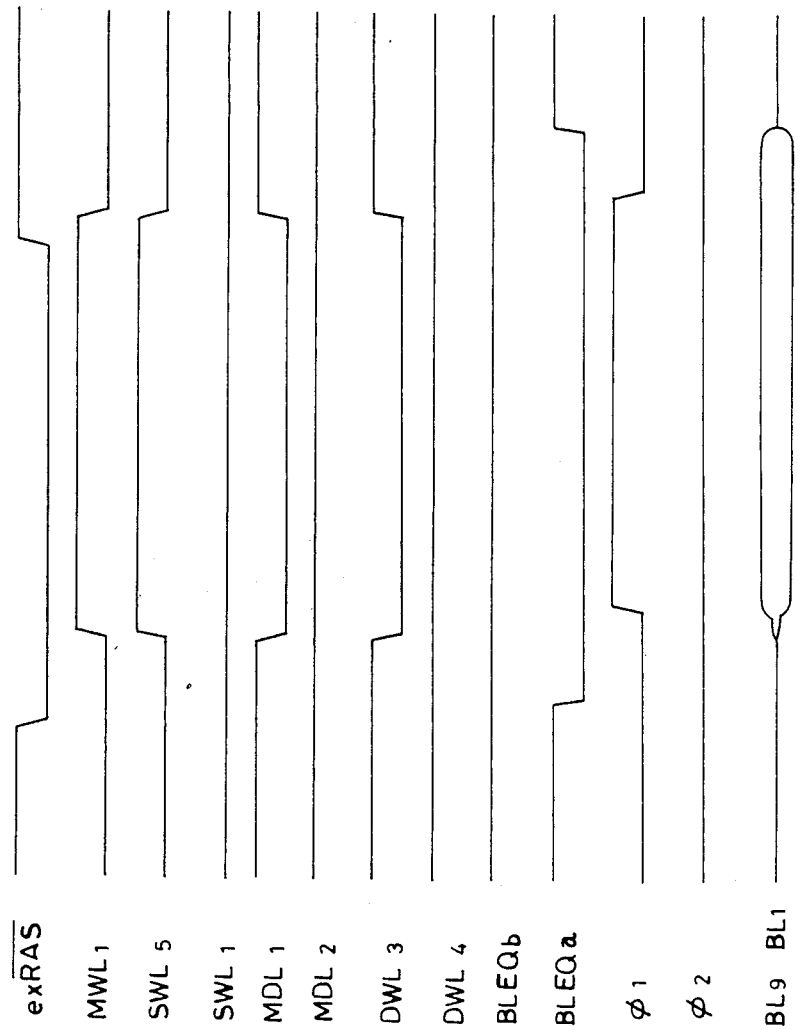
FIG. 2 is a timing chart illustrative of a reading operation of the DRAM of FIG. 1.

The manner in which information is read from memory cell MC2 will be described by way of example with reference to the timing chart of FIG. 2.

First, when a reading operation is started with a fall of an external signal exRAS, main word line MWL1 and supplementary word line SWL5 are connected to each other by switch SW12, and main word line MWL1 and supplementary word line SWL1 are disconnected from each other by switch SW11.

Next, precharge potential BLEQa falls, and the paired bit lines BL1 and BL9 become the floating state with their potential maintained at $V_{BL}$. At this time, precharge potential BLEQb remains at "H" level. In other words, bit line pair BL2 and BL10 adjacent bit line pair BL1 and BL9 are maintained at fixed potential $V_{BL}$. At this time, supplementary word line SWL6 is connected to main word line MWL2, with supplementary word line SWL2 disconnected therefrom. Similar connection and disconnections of the supplementary word lines are made for main word lines MWL3 and MWL4 also. Main dummy word lines MDL1 and MDL2 are connected to supplementary dummy word lines DWL3 and DWL4 by switches SD12 and SD22, but not to supplementary dummy word lines DWL1 and DWL2.

Subsequently, when the potential of main word line MWL1 rises, the potential of supplementary word line SWL5 connected thereto also rises simultaneously, whereby the information potential of memory cell MC2 is output to bit line BL9. The potentials of the other main word lines and supplementary word lines are all at "L" level at this time.

On the other hand, the potential of main dummy word line MDL1 falls in response to the rise of main word line MWL1, and the potential of supplementary word line SD12 connected thereto also falls simultaneously. This operation cancels the influence of the potential variation on bit line BL9 due to the rise of supplementary word line SWL5.

Since bit line BL1 paired with bit line BL9 is in the floating state, the reference potential is maintained. Looking at the entire memory cell array, information charges are output to bit lines BL9, BL11, BL13 and BL15 of sub-array #2 while bit lines BL1, BL3, BL5 and BL7 in sub-array #1 paired with those bit lines act as reference bit lines maintained in the floating gate state at the reference potential. The remaining bit lines BL2, BL4, BL6 and BL8 in sub-array #1 and bit lines BL10, BL12, BL14 and BL16 in sub-array #2 are biased to the fixed potential since precharge potential BLEQb remains at "H" level. That is, no data output takes place for these bit lines when the data is read from memory cell MC2, nor do these bit lines form pairs with the bit lines to which the data are output.

Next, signal $\phi 1$ provided by the sub-array activating clock generator 6 becomes "H" level to active sense amplifiers SA1, SA3, SA5 and SA7, thereby amplifying the potentials of bit line pairs BL9 and BL1, BL11 and BL3, BL13 and BL5, and BL15 and BL7, respectively. On the other hand, precharge potential BLEQb and activating signal $\phi 2$ remain uncharged, leaving bit lines BL2, BL4, BL6, BL8, BL10, BL12, BL14 and BL16 at fixed potential $V_{BL}$.

Figure 3:
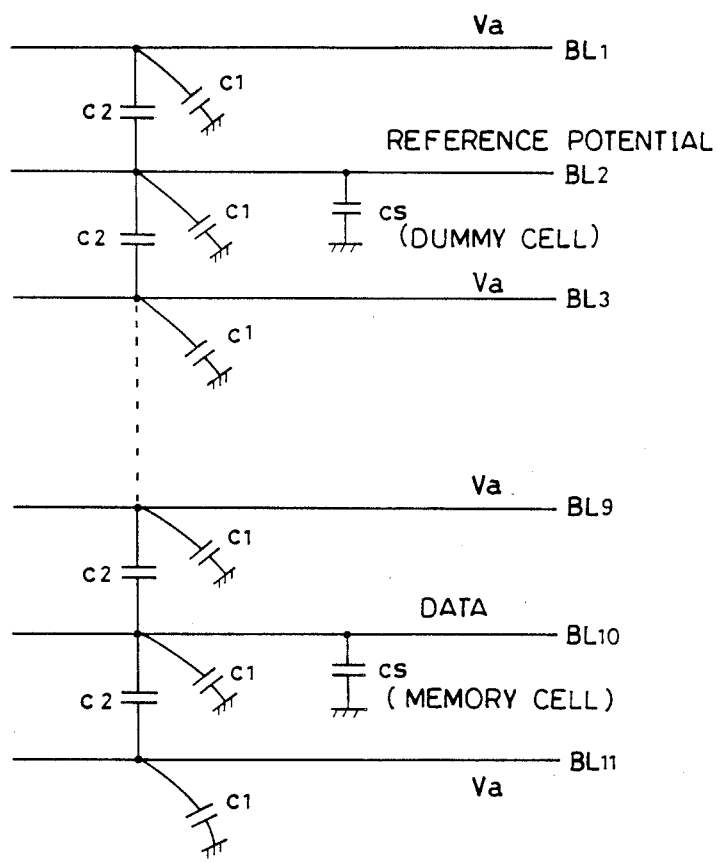
FIG. 3 is a view showing the state of an equivalent circuit occurring when the DRAM of FIG. 1 carries out a reading operation.

A potential difference between the bit lines forming a pair in data reading will be calculated here. A potential difference occurring at a data reading time between bit lines BL2 and BL10 in FIG. 1 is determined by way of example. FIG. 3 shows an equivalent circuit for this case.

In FIG. 3, reference $C_1$ denotes a capacitance occurring between each bit line and ground potential through a substrate, $C_2$ a capacitance between adjacent bit lines, and $C_S$ a capacity of each memory cell or dummy cell. It is assumed that bit lines BL2 and B10 have potentials $V_{BL2}$ and $V_{BL10}$, respectively, and that the precharge level of the bit lines is Veq. The level of potential Va of bit lines BL1, BL3, BL9 and BL11 biased to the fixed potential is also assumed to be equal to precharge level Veq.

The following equation is formed for the charges of bit line BL10 before and after the data reading:

$$C_1 Veq + C_S(\tfrac{1}{2} \pm \tfrac{1}{2}) V_{cc} = C_1 V_{BL10} + \quad (4)$$

-continued $$C_2 (V_{BL10} - V_{BL11}) + C_2 (V_{BL10} - V_{BL9}) + C_S V_{BL10}$$

The plus sign "+" in the parentheses of the coefficient of $V_{cc}$ in the left side of this equation signifies that the memory cell stores "H" level information ($V_{cc}$ writing), while the minus sign "−" signifies that the memory cell stores "L" level information (OV writing).

The left side of equation (4) shows the charges stored in capacitance $C_1$ and capacity $C_s$ of the memory cell before the data reading. The right side shows the charges stored in capacitance $C_1$, capacitance $C_2$ between adjacent bit lines and memory cell capacity $C_s$ after the data reading.

Further, the following equation is formed for the charges of bit line BL2 before and after the data reading:

$$C_1 Veq + C_s V_{cc}/2 = C_1 V_{BL2} + \quad (5)$$

$$C_2 (V_{BL2} - V_{BL1}) + C_2 (V_{BL2} - V_{BL3}) + C_s V_{BL2}$$

The left side of equation (5) shows the charges stored in capacitance $C_1$ and capacity $C_s$ of the dummy cell before the data reading. The right side shows the charges stored in capacitance C1, capacitance C2 between adjacent bit lines and dummy cell capacity $C_s$ after the data reading. When the information charge is output to bit line BL10, the potential of bit line BL2 becomes the reference potential.

Potential difference $\Delta V$ between bit lines BL10 and BL2 are derived from equations (4) and (5) as follows:

$$\Delta V = |V_{BL10} - V_{BL2}| = C_s V_{cc}/2(C_1 + 2C_2 + C_s) \quad (6)$$

When the right side of equation (6) is compared with that of equation (3) for the conventional DRAM, the $C_s$ in the denominator has a smaller coefficient 2. Thus, difference $\Delta V$ in the read potential in the DRAM according to this embodiment is greater than that in the conventional DRAM, which means an increased reading margin.

Figure 4A:
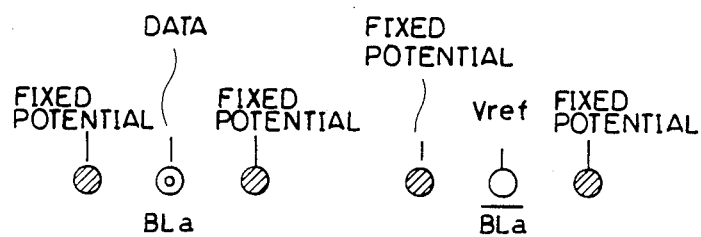
FIG. 4A is a view showing the potential states of bit lines occurring when the DRAM according to the first embodiment of this invention carries out a reading operation.
Figure 4B:
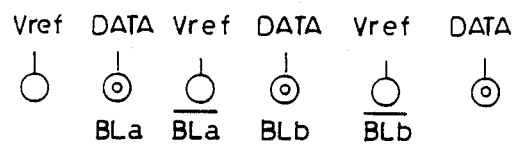
FIG. 4B is a view showing the potential states of bit lines occurring when a conventional DRAM carries out a reading operation.

FIG. 4A is a view showing the potential states of the bit lines occurring when the DRAM according to the first embodiment of this invention carries out a reading operation. FIG. 4B is a view showing the potential states of the bit lines occurring when the conventional DRAM carries out a reading operation.

Looking at conventional bit line pair BLa and $\overline{BLa}$ noise is produced for bit line $\overline{BLa}$ through capacitance $C_2$ by the data output to adjacent bit line BLb. The noise is variable with the data of the "H" or "L" level output to bit line BLb, and dependent on the pattern of the read potential based on its potential variation.

In the embodiment of this invention, on the other hand, bit line pairs BLa and $\overline{BLa}$ and the bit lines adjacent thereto are biased to the fixed potential as shown in FIG. 4A. Consequently, the reading operation is free from the influence of the potential pattern output to the adjacent bit lines as in the prior art.

The features of this invention appearing at times of amplification by the sense amplifiers following the data reading will be described next.

Figure 5A:
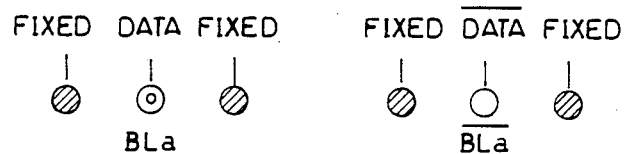
FIG. 5A is a view showing the potential states of bit lines occurring when a sense amplifier in the DRAM according to the first embodiment of this invention carries out an amplifying operation.
Figure 5B:
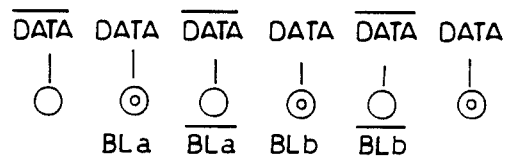
FIG. 5B is a view showing the potential states of bit lines occurring when a sense amplifier in a conventional DRAM carries out an amplifying operation.

FIG. 5A is a view showing the potential states of the bit lines occurring when a sense amplifier in the DRAM according to the first embodiment of this invention carries out an amplifying operation. FIG. 5B is a view showing the potential states of bit lines occurring when a sense amplifier in the conventional DRAM carries out an amplifying operation.

Looking at conventional bit line pair BLa and $\overline{BLa}$, noise is exchanged between bit line BLa and bit line $\overline{BLa}$ through capacitance $C_2$ since the bit lines are amplified to opposite potential levels. Further, bit line BLa receives the influence of noise imparted from a bit line in a different adjacent pair, which noise is variable with the level of the potential output thereto, while bit line $\overline{BLa}$ also receives the influence of noise imparted from bit line BLb and variable with the level of the potential output thereto.

In the embodiment of this invention, on the other hand, bit line pairs BLa and $\overline{BLa}$ and the bit lines adjacent thereto are biased to the fixed potential as shown in FIG. 5A. Consequently, the pattern dependency on the potential level of the information charges output to adjacent bit lines as observed in the prior art is now totally eliminated, and the bit line pair is entirely free from the mutual influences of noise.

FIG. 6 is a block diagram showing the memory cell array and adjacent components according to the first embodiment of this invention shown in FIG. 1.

Figure 8:
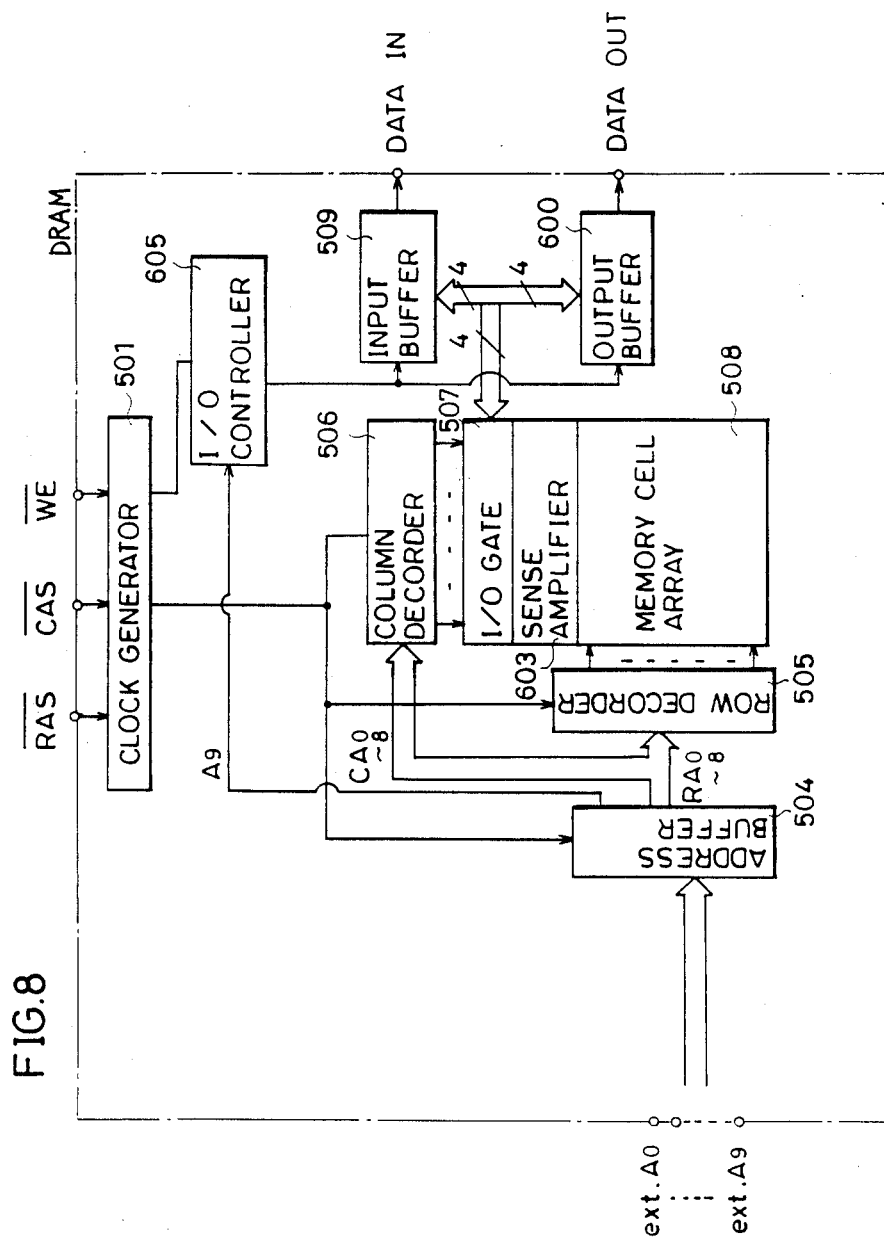
FIG. 8 is a view showing an example of conventional DRAMs.
Figure 9:
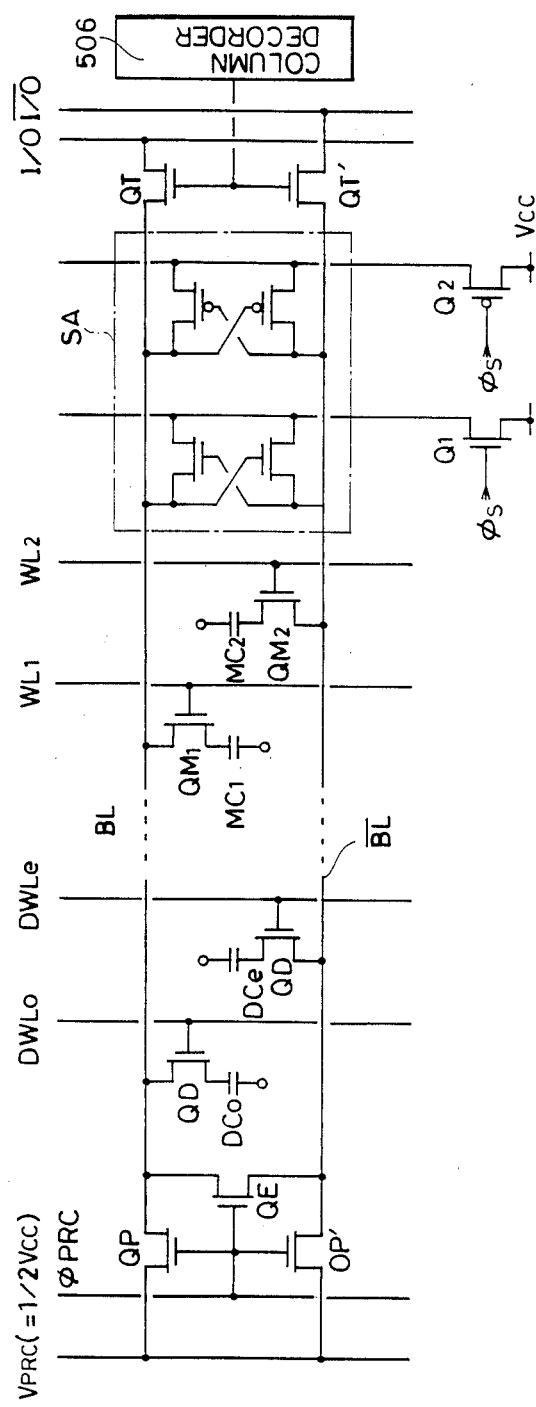
FIG. 9 is a view showing the specific construction of a portion of a memory cell array and a sense amplifier included in FIG. 8.
Figure 10:
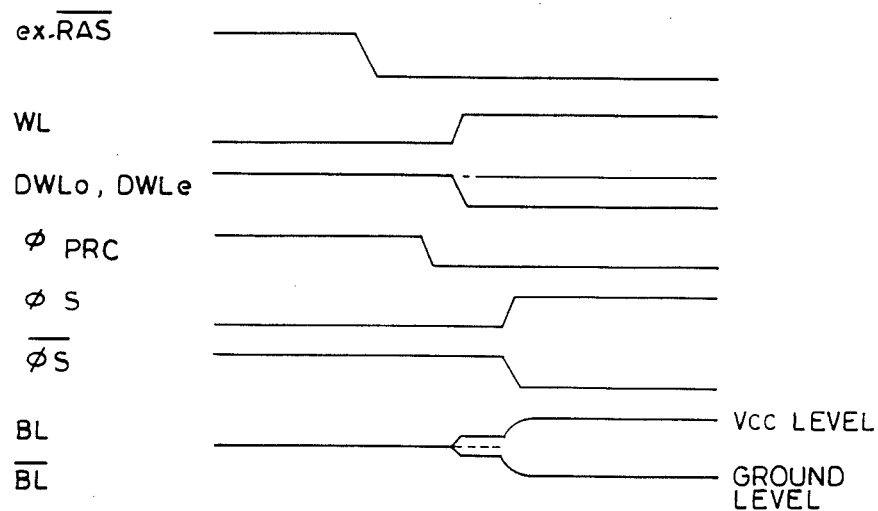
FIG. 10 is a timing chart of a reading operation of the DRAM of FIG. 9.
Figure 11:
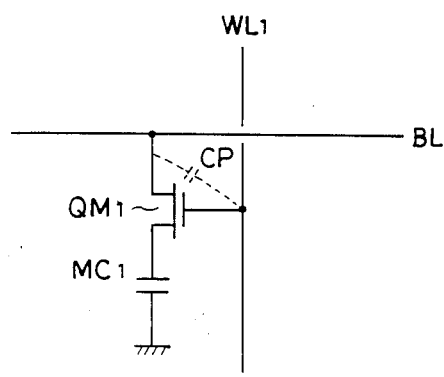
FIG. 11 is an enlarged view of a memory cell shown in FIG. 9.
Figure 12:
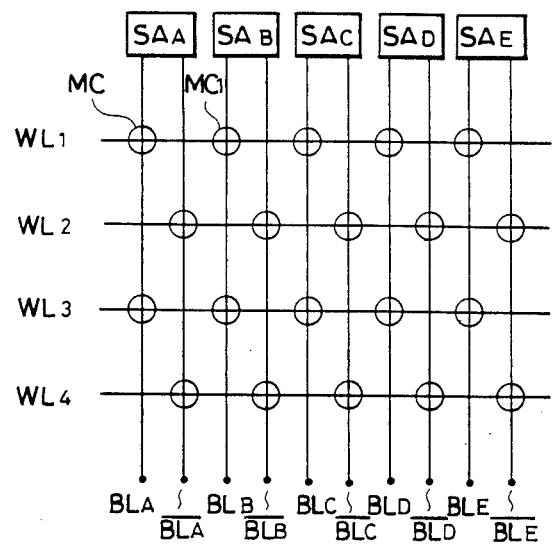
FIG. 12 is a view schematically showing the construction of a memory cell array in a conventional DRAM employing the folded bit line system.
Figure 13:
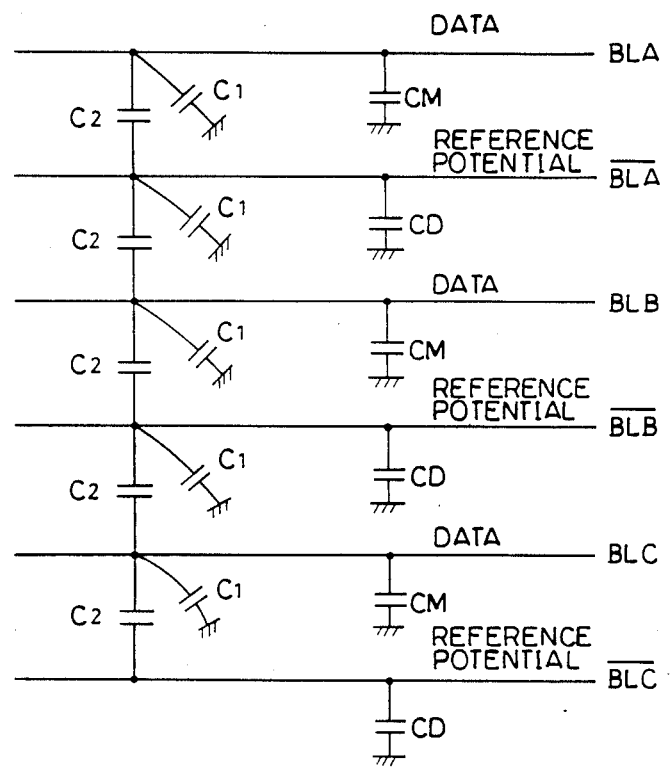
FIG. 13 is a view showing the state of an equivalent circuit occurring when the DRAM of FIG. 12 carries out a reading operation.

The blocked components omitted from FIG. 6 are the same as in the conventional construction shown in FIG. 8.

In FIG. 6, memory cell array 108 includes sub-arrays #1-#n, with sense amplifiers #1-#n provided for the respective sub-arrays. A reading operation will be described hereunder on the assumption that external address signals exA0-An are applied through an address buffer 104 to a row decoder 105, a column decoder 106 and sub-array activating clock generator 6.

The main word line, supplementary word line, main dummy word line and supplementary dummy word line to be selected are identified by the address signals applied to the row decoder 105, and the relevant switches are actuated accordingly. Further, a memory cell is identified by the address signals and, in order to activate the sense amplifier corresponding to the sub-array to which this memory cell belong, activating signal $\phi$ is transmitted from the sub-array activating clock generator 6 to the prescribed sense amplifier.

The data thus read is output externally through a Dout buffer 100.

The writing operation and refresh operation are basically the same as the reading operation, and the other signals and functions of the buffers correspond to those of the conventional example, wherefore their explanation is not repeated here.

Figure 7:
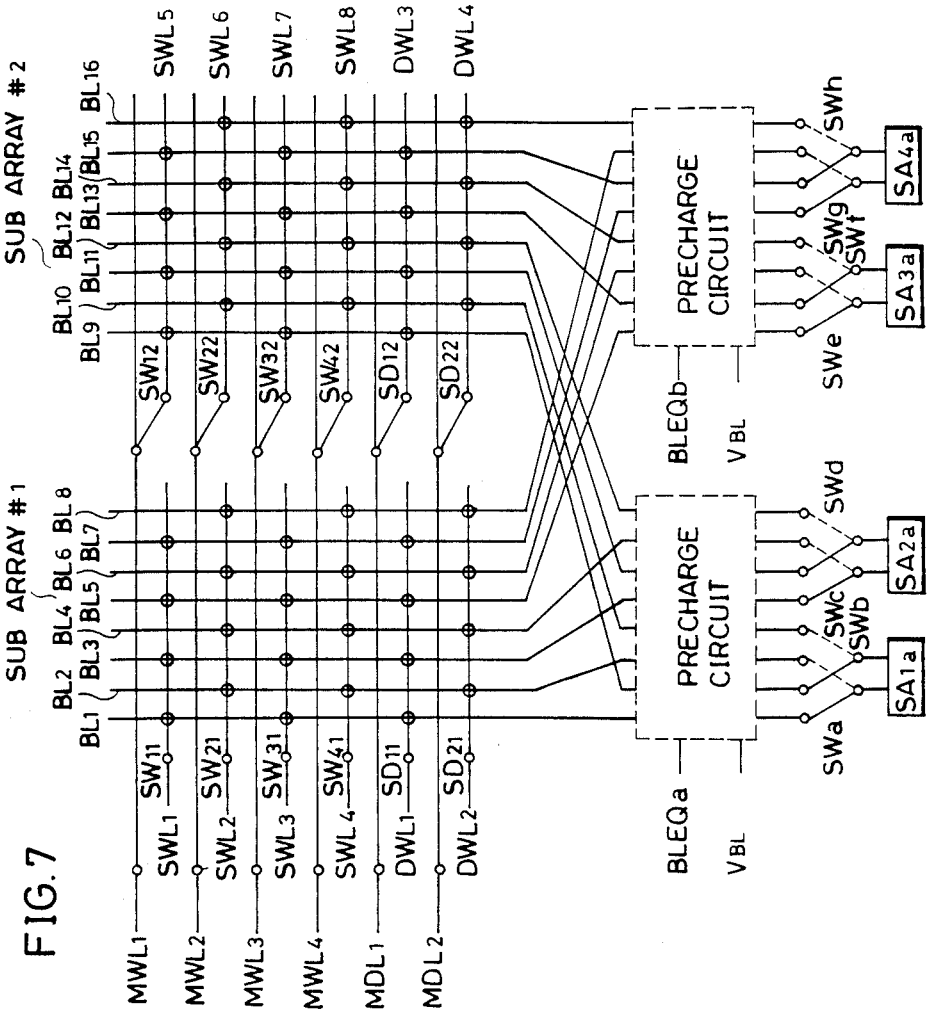
FIG. 7 is a view showing the construction of a memory cell array in a DRAM according to a second embodiment of this invention.

FIG. 7 is a view showing the construction of a memory cell array in DRAM according to a second embodiment of this invention.

The embodiment of FIG. 7 differs from the embodiment of FIG. 1 in the number of sense amplifiers and in that switches SWa-SWh are now provided between the sense amplifiers and precharge circuits. The other structural features are common between the first and second embodiments, and the distinguishing aspects will mainly be described hereunder.

In this embodiment, one sense amplifier is provided for two pairs of bit lines. For example, a sense amplifier SA1a is associated with bit line pair BL1 and BL9 and bit line pair BL2 and BL10. When supplementary word line SWL5 is selected and data are output to bit line pair BL1 and BL9, for example, a switch SWa is operated for causing sense amplifier SA1a to amplify the data output. Since a switch SWb remains out of operation at this time, no reading operation takes place for bit line pair BL2 and BL10 adjacent bit line pair BL1 and BL9, with the potential thereof remaining at the floating state isolated from the precharge potential. In this way, the number of sense amplifiers may be half the number in the first embodiment, which is achieved by arranging that one sense amplifier is shared with a bit line pair for which a reading operation is carried out and a bit line pair for which a reading operation does not take place in parallel with the first mentioned reading operation. This construction has the advantages of facilitating layout of the sense amplifiers and realizing a reduction in the area occupied by semiconductor chips.

The two embodiments described hereinbefore employ what is known as the dummy cell reversal system which selects the dummy cell connected to the same bit line to which a selected memory cell is connected. However, the invention may be applied likewise, to produce like effects, to what is known as the same phase dummy system which selects the dummy cell connected to the bit line opposed to and paired with the bit line to which a selected memory cell is connected.

While, in the two described embodiments, the memory cell area is divided into two parts, i.e., sub-array #1 and sub-array #2, the division is not limited to such but the area may be divided into three or more sub-arrays.

Further, although the two embodiment have been described in relation to DRAMs employing the folded bit line system, the concept of this invention is of course applicable to a DRAM of the open bit line system also.

According to this invention, as described above, when information stored in memory cells is output to a certain bit line pair, the potential of bit lines adjacent those bit lines is maintained at a predetermined potential. Further, the bit lines forming a pair are not arranged adjacent each other. Thus, this invention totally eliminates the influences of the read potential among adjacent bit lines, thereby increasing the operating margin for the reading operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
    a plurality of memory cells arranged in a matrix of rows and columns for storing information charges,
    a plurality of bit line pairs each constituted of two bit lines spaced away from each other, each of said bit lines corresponding to a row of said memory cells and connected to the memory cells in the corresponding row,
    a plurality of word lines extending in a direction to intersect said bit line pairs, each of said word lines corresponding to a column of said memory cells and connected to the memory cells in the corresponding column,
    read means for selecting one of said word lines by applying a potential thereto, and outputting the information charge of each of the memory cells connected to the selected word line to one of the bit lines in each of said bit line pairs,
    a plurality of sense amplifiers provided one for each of said bit line pairs for detecting a potential difference occurring between the bit lines in each of said bit line pairs when the information charges are read from the memory cells by said read means, and potential holding means for maintaining, at a predetermined potential, bit lines adjacent the bit lines in each of the bit line pairs which is connected to the memory cell from which the information charge is read when the information charges are read from the memory cells by said read means.

2. A semiconductor memory device as claimed in claim 1 further comprising potential applying means for applying a potential to the bit line to cancel a variation in the potential of the bit line thereof caused by an increase in the potential of the word line selected by said read means.

3. A semiconductor memory device as claimed in claim 1 wherein a memory area, in which said memory cells are disposed, is divided into a first sub-array area and a second sub-array area, one of the bit lines forming each of said bit line pairs being arranged in said first sub-array area, and the other of the bit lines forming each of said bit line pairs being arranged in said second sub-array area.

4. A semiconductor memory device as claimed in claim 3 wherein each of said word lines is divided at a boundary between said first and second sub-array areas into a first word line belonging to said first sub-array area and a second word line belonging to said second sub-array area, said read means applying the potential to one of said first and second word lines of the selected word line.

5. A semiconductor memory device as claimed in claim 4 further comprising potential applying means for applying a potential to the bit line to cancel a variation in the potential thereof caused by an increase in the potential of the word line selected by said read means.

6. A semiconductor memory device as claimed in claim 5 wherein said bit lines are arranged by a folded bit line system.

7. A dynamic semiconductor memory device comprising;

a plurality of memory cells arranged in a matrix of rows and columns for storing information charges, a first memory cell area including a half of said memory cells, a second memory cell area including the remaining half of said memory cells, a plurality of bit line pairs each constituted of two bit lines, one of said bit lines corresponding to a row of said memory cells formed in said first memory cell area, and the other bit line corresponding to a row of said memory cells formed in said second memory cell area, each bit line being connected to the memory cells in each of the corresponding rows, a plurality of word lines each extending in a direction to intersect said bit line pairs and corresponding to a column of said memory cells, each of said word lines being divided at a boundary between said first and second memory cell areas into a first word line belonging to said first memory cell area and a second word line belonging to said second memory cell area, and connected to the memory cells in the corresponding column, read means for selecting one of said word lines and applying a potential to one of the first and second word lines of the selected word line to output the information charge of each of the memory cells connected to the selected one of said first and second word lines to one of the bit lines in each of said bit line pairs, a plurality of sense amplifiers each provided corresponding to each of said bit line pairs for detecting a potential difference occurring between the bit lines in each of said bit line pairs when the information charges are read from the memory cells by said read means, and potential holding means for maintaining, at a predetermined potential, bit lines adjacent the bit lines in each of the bit line pairs which is connected to the memory cell from which the information charge is read when the information charges are read from the memory cells by said read means.

8. A semiconductor memory device as claimed in claim 7 wherein two bit lines adjacent each of the bit lines in each of said bit line pairs forms one of said bit line pairs.

9. A semiconductor memory device as claimed in claim 8 wherein said bit line pairs are constituted of a first group of bit line pairs and a second group of bit line pairs, said first group of bit line pairs including alternate bit lines in said first memory cell area and alternate bit lines in said second memory cell area, and said second group of bit line pairs including all the bit lines excluding the bit lines forming said first group of bit line pairs.

10. A semiconductor memory device as claimed in claim 9 wherein said sense amplifiers are constituted of a first group of sense amplifiers corresponding to said first group of bit line pairs, and a second group of sense amplifiers corresponding to said second group of bit line pairs.

11. A semiconductor memory device as claimed in claim 10 wherein said potential holding means is operable to activate only one of said first and second groups of sense amplifiers corresponding to one of said first and second groups of bit line pairs including the bit line to which the information charge of the memory cell is output by said read means.

12. A semiconductor memory device as claimed in claim 9 wherein each of said sense amplifiers is provided for one of the bit line pairs in said first group of bit line pairs and a bit line pair adjacent thereto in said second group of bit line pairs, and connected to the one of the bit line pairs in said first group of bit line pairs when applying the potential to the first word line of the word line selected by said read means, and to the one of the bit line pairs in said second group of bit line pairs when applying the potential to the second word line of the word line selected by said read means.

13. A semiconductor memory device as claimed in claim 12 further comprising potential applying means for applying a potential to the bit line to cancel a variation in the potential thereof caused by an increase in the potential of one of the first and second word lines selected by said read means.

14. A semiconductor memory device as claimed in claim 13 wherein said potential applying means includes;

a plurality of dummy cells each provided for each bit line, a plurality of dummy word lines each extending in a direction to intersect said bit line pairs and corresponding to each of said dummy cells, each of said dummy word lines being divided at the boundary between said first and second memory cell areas into a first word line belonging to said first memory cell area and a second dummy word line belonging to said second memory cell area, and connected to the corresponding dummy cell, a predetermined potential being applied to each of said dummy word lines, and potential canceling means operable in response to selection of one of said first and second word lines by said read means, for canceling said predetermined potential applied to one of the first and second dummy word lines connected to one of said dummy cells provided for the bit lines to which the memory cells connected to the selected word line are connected.

* * * * *

UNITED STATES PATENT AND TRADEMARK OFFICE
CERTIFICATE OF CORRECTION

PATENT NO. : 4,982,368

DATED : January 1, 1991

INVENTOR(S) : Kazutami ARIMOTO

It is certified that error appears in the above-identified patent and that said Letters Patent is hereby corrected as shown below:

On the title page:

After "[22] Filed: January 10, 1990" please add

--[30] Foreign Application Priority Data

Oct. 2, 1989 [JP] Japan ........... 1-257216--

Signed and Sealed this

Nineteenth Day of May, 1992

*Attest:*

DOUGLAS B. COMER

*Attesting Officer*　　　　*Acting Commissioner of Patents and Trademarks*